(12) United States Patent
Kawaguchi et al.

(10) Patent No.: US 6,309,486 B1
(45) Date of Patent: Oct. 30, 2001

(54) POLYCHROMATIC ORGANIC ELECTROLUMINESCENT DEVICE AND METHOD OF MANUFACTURING THE SAME

(75) Inventors: Koji Kawaguchi; Toshiyuki Kanno, both of Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/697,390

(22) Filed: Oct. 26, 2000

Related U.S. Application Data

(62) Division of application No. 09/172,779, filed on Oct. 14, 1998.

(30) Foreign Application Priority Data

Oct. 14, 1997 (JP) ................................................ 9-280320

(51) Int. Cl.$^7$ .................................................. H01J 1/88
(52) U.S. Cl. ........................... 156/67; 313/498; 313/505; 313/506; 313/507
(58) Field of Search ............................. 156/67; 313/498, 313/505, 506, 507, 510, 512, 112; 315/169; 427/66; 445/24, 25

(56) References Cited

U.S. PATENT DOCUMENTS 5,909,081 * 1/1999 Eida et al. ............................ 313/504

* cited by examiner

*Primary Examiner*—Michael W. Bail
*Assistant Examiner*—Jessica Rossi
(74) *Attorney, Agent, or Firm*—Morrison Law Firm

(57) ABSTRACT

A functional laminate film protects a color conversion filter and an organic electroluminescent element from mutual contamination during manufacture and use. The functional laminate film includes a transparent base film, a coupling layer and a hard coat layer. The coupling layer is bonded to the color conversion filter to present a flat surface with substantial reduction in optical defects. The hard coat layer is hard enough to withstand the formation of the organic electroluminescent element on its upper surface. The hard coat layer also acts as a barrier to prevent chemical species from the fluorescent materials within the color conversion filter from adversely affecting the organic electroluminescent element during manufacture and operation, and vice versa. The result is an improved polychromatic electroluminescent device composed of the organic electroluminescent element, the functional laminate film and the color conversion filter. The device has a greatly improved angle of visibility, high quality output and extended usable life.

1 Claim, 4 Drawing Sheets

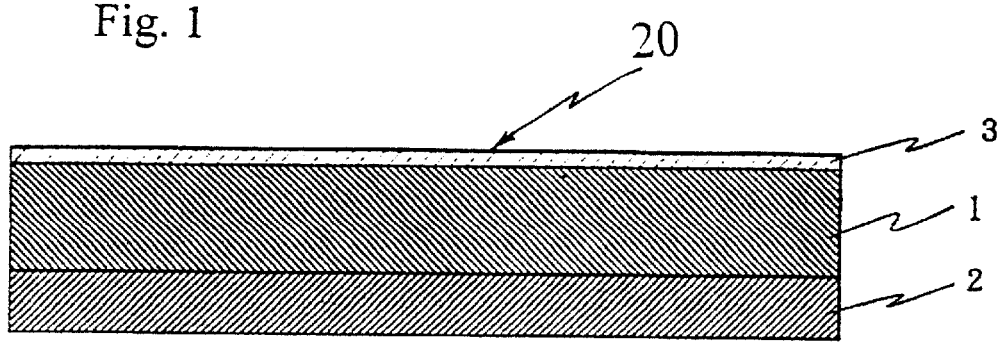
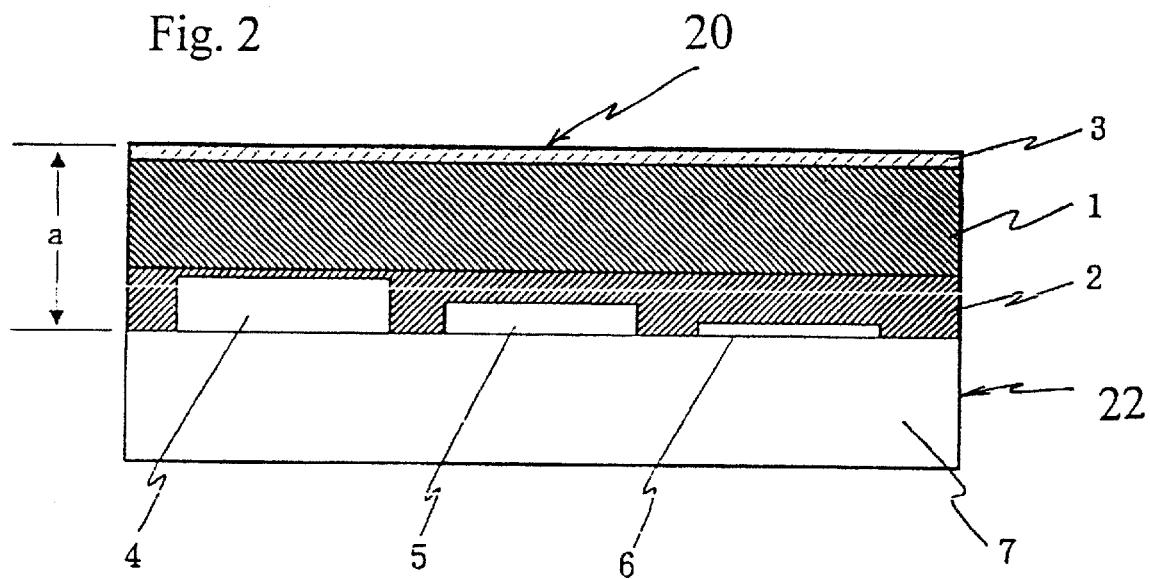

Prior Art

POLYCHROMATIC ORGANIC ELECTROLUMINESCENT DEVICE AND METHOD OF MANUFACTURING THE SAME

This application is a division of pending U.S. application Ser. No. 09/172,779, filed Oct. 14, 1998 now pending.

BACKGROUND OF THE INVENTION

New developments in organic electroluminescent (hereafter referred to as "EL") devices have been vigorously explored since Tang et al. reported an EL device that obtains a high luminance at a low applied voltage. For example, Tang et al. shows a luminance of 1000 cd/m$^2$ at an applied voltage of 10 V (cf. Appl. Phys. Lett., 51, 913 (1987)). The organic EL device has a light-emitting thin film that features a low drive voltage, high resolution and a wide field of view. These characteristics make it especially usefull in flat-panel displays. However, to use the organic EL device in other applications, it must also have the capability to emit polychromatic light.

A polychromatic display can be constructed with EL elements formed in a planar arrangement. In this configuration, each EL element emits a predetermined pattern of light in one of the three primary colors: red, green or blue. An alternative arrangement combines three color filters that pass red, green or blue light, respectively, from an element that emits white light.

The manufacturing process for the patterned organic EL elements is complicated and makes mass production very difficult. Moreover, the patterning process lowers the light-emitting efficiency of the organic EL elements. The color filter method requires an element that emits a bright and stable white light. No such element has yet been obtained.

A color conversion method has been proposed that includes filters made of fluorescent material. For example, Japanese Unexamined Laid Open Patent Applications No. H03-152897 and No. H05-258860 propose fluorescent material that absorbs light from an organic EL element and emits fluorescent light in the visible spectrum. The light emitted from the organic EL element need not be limited to white for the color conversion method to work. A single color light-emitting element that emits a brighter light may be used as a source. For example, an organic EL element that emits blue light effects the color conversion to a longer wavelength with an efficiency that exceeds 60%.

However, the materials used for converting the emitted light to a desired wavelength are very sensitive to conventional environments. All the conventional materials that have been examined by the present inventors for use as color converters display an undesirable sensitivity to specific light wavelengths, heat, moisture and organic solvents. The sensitivity of these fluorescent materials is such that they are easily decomposed when exposed to environments with the above characteristics. This sensitivity places severe limitations on the design and manufacture of a polychromatic light-emitting device based on the color conversion method.

The Japanese Unexamined Laid Open Patent Application No. H08-279394 proposes a polychromatic light-emitting device that protects the fluorescent materials within the device with an insulative inorganic oxide layer. In this conventional structure, an insulative inorganic oxide layer protects the fluorescent layers from degradation due to exposure. The insulative inorganic oxide layer is interposed between the fluorescent layers and an organic EL element. A fluorescent protection layer and an adhesive layer are applied between the fluorescent layers and the insulative inorganic oxide layer. The above patent application discloses the following four laminate structures:

(1) A transparent substrate/fluorescent layers/a transparent and electrically insulative inorganic oxide layer/an organic EL element;

(2) A transparent substrate/fluorescent layers/an adhesive layer/a transparent and electrically insulative inorganic oxide layer/an organic EL element;

(3) A transparent substrate/fluorescent layers/a protection layer (transparent flattening layer)/an adhesive layer/a transparent and electrically insulative inorganic oxide layer/an organic EL element; and (4) A transparent substrate/fluorescent layers/a protection layer (transparent flattening layer)/a transparent and electrically insulative inorganic oxide layer/an organic EL element.

The fluorescent materials that produce the different colors each have different conversion efficiencies. The brightness of the colors produced by the fluorescent layers of a color filter (hereinafter referred to as a "color conversion filter") are balanced by varying the thickness of the specific material needed for a given color. As shown in FIG. 5, the thickness differences cause steps in the surface of the color conversion filter mounted on a transparent substrate 7 such as a glass substrate. Results of experiments conducted by the present inventors show that the wavelength conversion using the red fluorescent material is much less efficient than that of other color fluorescent materials. A red fluorescent layer 4 must therefore be several tens of micrometers thick to obtain emitted light that has a high color purity. However, the thickness of the higher efficiency green fluorescent layer 5 is only 4 to 10 $\mu$m. Similarly, a blue fluorescent layer 6 has a thickness of less than 5 $\mu$m. The difference in thickness of the fluorescent materials forms a step of 10 $\mu$m or more between the red fluorescent layer 4 and the green and blue fluorescent layers 5 and 6, respectively. In the instance where the EL element light source emits blue light, there is no need for a blue fluorescent layer. That is, the thickness of the blue fluorescent layer 6 is 0 $\mu$m.

When a transparent insulative inorganic oxide layer 14 is formed on the fluorescent layers above, the surface inevitably contains concave and convex portions, as shown in FIG. 6. The concave and convex portions of the surface adversely affect the color purity and the angle of visibility of the light-emitting device. It is difficult to form the transparent insulative inorganic oxide layer 14 with a flat surface. The adverse effects on color purity and angle of visibility are therefore difficult to remove.

Protection and adhesive layers are formed in turn over the fluorescent material layers of the color conversion filter. During this process, the fluorescent materials are repeatedly exposed to heat and light. The exposure of the fluorescent materials to heat and light is necessary to form and cure the protection and adhesive layers. However, it is difficult to completely prevent deterioration in the fluorescent materials caused by the repeated exposure to heat and light.

A protective resin coat can be applied over a color conversion filter on a transparent substrate. The protective resin coat is thinner where it covers the stepped fluorescent layers of the filter, and can not adequately accomplish its protective function. If the protective layer is to function properly, it must be thickened to avoid the formation of thin portions. However, increasing the thickness of the protection layer also increases the distance between the color conversion filter and the EL elements. As the distance between the color conversion filter and the EL element grows, the angle of visibility narrows. Moreover, the materials and construction method for the protection layer are limited due to the high sensitivity of the fluorescent materials to chemical reagents, moisture, light and heat. The complicated manufacturing steps necessary to form the above described layer structures make the conventional device structures industrially disadvantageous.

OBJECTS AND SUMMARY OF THE INVENTION

In view of the foregoing, it is an object of the invention to provide a polychromatic EL device which exhibits a wide angle of visibility.

It is another object of the invention to provide a polychromatic EL device that includes an EL element which is prevented from deterioration during the device manufacturing process.

It is a further object of the invention to provide a polychromatic EL device that includes fluorescent materials which are also prevented from deterioration during the device manufacturing process.

It is still another object of the invention to provide a method of manufacturing such a polychromatic EL device.

Still another object of the invention is to provide a polychromatic EL device that does not suffer from degradation when operated, thus extending its usable life.

Briefly stated, the present invention provides a functional laminate film that protects a color conversion filter and an organic electroluminescent element from mutual contamination during manufacture and use. The functional laminate film includes a transparent base film, a coupling layer and a hard coat layer. The coupling layer is bonded to the color conversion filter to present a flat surface with substantial reduction in optical defects. The hard coat layer is hard enough to withstand the formation of the organic electroluminescent element on its upper surface. The hard coat layer also acts as a barrier to prevent chemical species from the fluorescent materials within the color conversion filter from adversely affecting the organic electroluminescent element during manufacture and operation, and vice versa. The result is an improved polychromatic electroluminescent device composed of the organic electroluminescent element, the functional laminate film and the color conversion filter. The device has a greatly improved angle of visibility, high quality output and extended usable life.

According to an embodiment of the invention, there is provided a polychromatic organic electroluminescent device comprising: a color conversion filter including a transparent substrate and a plurality of fluorescent layers on the transparent substrate, the fluorescent layers being spaced apart from each other, an organic electroluminescent element including an organic light-emitting layer, a functional laminate film interposed between the color conversion filter and the organic electroluminescent element, the color conversion filter and the organic electroluminescent element being arranged such that each of the fluorescent layers absorb light emitted from the organic light-emitting layer and emits light in a wavelength corresponding to a color of its respective fluorescent layer, the functional laminate film including a transparent base film, a transparent hard coat layer on an upper surface of the transparent base film and a coupling layer on a lower surface of the transparent base film, the hard coat layer being transparent to light from the organic electroluminescent element and gas impermeable, the hard coat layer having a hardness being capable of enduring formation of the organic electroluminescent element on an upper surface thereof and the coupling layer being made of one of a photo-curing resin and a thermosetting resin which hardens at 150° C. or lower.

According to a method of the invention, there is provided a technique of manufacturing a polychromatic organic electroluminescent device comprising: depositing a plurality of spaced apart fluorescent layers on a transparent substrate to form a color conversion filter, depositing a transparent hard coat layer on one surface of a transparent base film, depositing a coupling layer on another surface of the transparent base film to form a functional laminate film, bonding the functional laminate film onto the color conversion filter with the coupling film facing the color conversion filter, and forming an organic electroluminescent element on a surface of the transparent hard coat layer.

According to another embodiment of the invention, there is provided a functional laminate film comprising: a transparent base film, a hard coat layer and a coupling layer, the base film interposed between the hard coat layer and the coupling layer, the functional laminate film adapted to be disposed on a color conversion filter such that the coupling layer faces the color conversion filter, the hard coat layer being capable of withstanding formation of an organic electroluminescent element on a surface thereof, and the hard coat layer being of a type that blocks transfer of materials capable of degrading function of the color conversion filter and the organic electroluminescent element.

According to still another embodiment of the invention, there is provided a polychromatic organic electroluminescent device comprising: a color conversion filter including a transparent substrate and a plurality of color conversion layers on the transparent substrate, the color conversion layers being space apart from each other, an organic electroluminescent element including an organic light-emitting layer, a functional laminate film interposed between the color conversion filter and the organic electroluminescent element, the color conversion filter and the organic electroluminescent element being arranged such that the color conversion layers receive light emitted from the organic light-emitting layer and produce light in a wavelength corresponding to a color of respective the color conversion layers, the functional laminate film including a transparent base film, a transparent hard coat layer on an upper surface of the transparent base film and a coupling layer on a lower surface of the transparent base film, the hard coat layer being transparent to light from the organic electroluminescent element and gas impermeable, the hard coat layer having a hardness being capable of enduring formation of the organic electroluminescent element on an upper surface thereof, and the coupling layer being made of one of a photo-curing resin and a thermosetting resin which hardens at 150° C. or lower.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a cross section of a functional laminate film according to an embodiment of the invention.

FIG. 2 is a cross section of a color conversion filter assembled with the functional laminate film of FIG. 1.

DETAILED DESCRIPTION OF THE INVENTION

The present invention prevents the deterioration of the fluorescent materials that accompanies the manufacturing processes of the prior art. The prior art has the disadvantage of deterioration of the fluorescent materials due to repeated exposure to heat and/or light. The present invention avoids repeated exposure to heat or light, thus preventing excessive deterioration of the fluorescent materials. The resulting color conversion filter has excellent color quality and conversion capacity. Moreover, the coupling layer in the functional laminate film creates a flat surface over the spaced-apart color fluorescent layers. The coupling layer also has the feature that it can be thin in parts without a degradation in performance. The distance between the color conversion filter and the organic EL element is reduced, producing a wide angle of visibility for the color display device. The simplified manufacturing method, according to the present invention, of bonding the functional laminate film onto the color conversion filter effectively protects the fluorescent materials from further deterioration.

Figure 3:
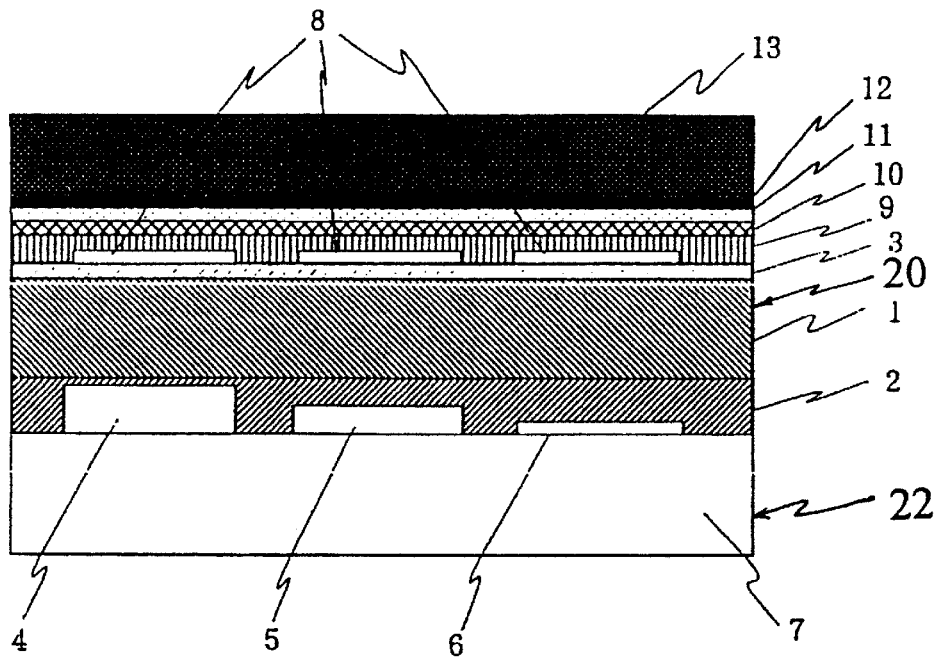
FIG. 3 is a cross section of a polychromatic organic El device using the laminate of FIGS. 1 and 2.

Referring to FIGS. 1 through 3, the functional laminate film 20 according to the present invention includes a hard coat layer 3 above a transparent base film 1. A coupling layer 2 is positioned on the lower surface of the transparent base film 1. An EL element is formed and mounted on the upper surface of the hard coat layer 3.

The coupling layer 2 of the functional laminate film 20 is made of a photo-curing resin or a thermosetting resin that cures at 150° C. or lower. The functional laminate film 20 is bonded onto, and provides protection for, a color conversion filter 22. The color conversion filter 22 is composed of spaced-apart fluorescent layers 4, 5 and 6 mounted on a flat transparent substrate 7. The colors of the fluorescent material layers 4, 5 and 6 are preferably red, green and blue respectively. Any of the fluorescent layers 4, 5 and 6 may be replaced by a color filter of corresponding color. A color filter is used to adjust the wavelength and the purity of the light emitted from an organic light-emitting layer 11.

The hard coat layer 3 blocks gases that are generated during the process of forming the EL element, which prevents degradation of the material in the sensitive fluorescent layers 4, 5 and 6 that perform color conversion. The hard coat layer 3 is hard and impermeable enough to block the gases used in forming the EL element without suffering degradation or corrosion. The strength of the hard coat layer 3 also makes it useful as a substrate for mounting the EL element. Moreover, the hard coat layer 3 is transparent to visible light.

The base film 1 is preferably made of a stable resin that does not yield any chemical species that may cause deterioration of the fluorescent materials or the organic EL element. The base film 1 exhibits this material stability over a temperature range from room temperature to 150° C. The thickness of the base film 1 is from 1 to 50 μm. Preferably, the thickness of the base film 1 is from 5 to 20 μm.

Undesirable qualities become apparent when the base film 1 is thinner than 1 μm. For example, it is difficult to flatten the color conversion filter 22. Also, the functional laminate film 20 is easily cut or marred. Furthermore, the workability of the functional laminate film 20 deteriorates and the laminating process consequently suffers. Depending on the refractive index of the material, the functional laminate film 20 and color conversion filter 22 exhibit undesirable characteristics when the base film 1 is thicker than 50 μm. For example, there is an increase in scattered light leakage from a fluorescent layer which is emitting light to adjacent fluorescent layers which are not emitting light, and the angle of visibility is narrowed.

The material of base film 1 is selected from those which are easily formed into a film. The material must also be transparent and resistant to heat generated during manufacture and while driving the device. An example of the required transparency is 50% or more in the wavelength range from 400 nm to 700 nm. Examples of materials with these characteristics include poly(ethylene terephthalate) (PET), polyethylene (PE), polypropylene (PP), polycarbonate (PC), polyacrylate (PA), poly(ether sulfone) (PES), poly (vinyl fluoride) (PFV) and polyetheretherketone (PEEK).

The coupling layer 2 of the functional laminate film 20 is made of a transparent polymer resin which does not contribute to deterioration of the fluorescent materials. The coupling layer 2 serves primarily to provide the color conversion filter 22 with a flat surface, without adversely affecting the color conversion characteristics of the filter. The coupling layer 2 also acts as a buffer between the color conversion filter 22 and the base film 1.

The coupling layer 2 should be highly adhesive and transparent. For example, a transparency of 50% or more in the wavelength range from 400 nm to 700 nm is desirable. When formed as a coating film disposed on the base film 1, the thickness of the coupling layer 2 is on the order of microns. Materials from which the coupling layer 2 may be constructed include crosslinking-type urethane resins, olefin resins, acrylic resins, epoxy resins, melamine resins, phenolic resins, alkyd resins, ester resins and amide resins. The coupling layer 2 may be coated on the base film 1 by any conventional coating method such as conventional spin-coating, roll-coating or cast-coating.

There are no limitations according to the present invention for the curing method used for the coupling layer 2. Thermosetting, moisture-curing, chemical curing and photo-curing may each be used alone or in an appropriate combination. The preferable temperature for the thermosetting curing method is up to about 70° C. to avoid deterioration of the fluorescent materials. The preferred photo-curing method uses visible light to avoid deterioration of the fluorescent materials.

An organic EL element is positioned on the hard coat layer 3, which in turn is disposed above the base film 1. The hard coat layer 3 protects the materials of the color conversion filter 22 from deterioration during the process of forming the organic EL element. The hard coat layer 3 works as a barrier against gases, organic solvents and low molecular compounds such as moisture and resin monomers. This barrier protects sensitive portions of the organic EL element formed on the functional laminate film 20 including anodes 8, organic layers and cathodes 13. Portions of the organic EL element are sensitive to moisture, oxygen, monomers and low molecular compounds yielded from the color conversion filter 22 through aging or heat that is generated from driving the device. The barrier formed by the hard coat layer 3 protects the sensitive portions of the organic EL element from these damaging influences. The hard coat layer 3 also facilitates formation of the anodes 8 of the organic EL element on the functional laminate film 20.

The hard coat layer 3 material blocks gases and organic solvents, and is highly transparent. The material can be easily adapted to coat the base film 1 with a thickness on the order of from nanometer to micron range. The hard coat layer 3 should have a hardness of H, or more preferably, 2H, as defined by corresponding pencil hardness designations. This level of hardness ensures that the hard coat layer 3 can endure the formation of anodes 8 on its upper surface. Materials from which the hard coat layer 3 may be constructed include polymers such as ester resins, epoxy resins, urethane resins and melamine resins, and inorganic oxides such as aluminum oxide, boric acid, barium oxide, germanium oxide, lithium oxide, magnesium oxide, lead oxide, silicon oxide, titanium oxide, zinc oxide and zirconia.

The color conversion filter 22 can be constructed using a number of conventional manufacturing methods. For example, the color conversion filter 22 includes a red fluorescent layer 4, a green fluorescent layer 5 and a blue fluorescent layer 6 which are spaced apart from one another and arranged on a planar transparent substrate 7. The planar transparent substrate 7 can be constructed of a conventional material such as a glass. There exists no limitation in selecting the method for forming the fluorescent layers 4, 5 and 6. Examples of methods for forming the fluorescent layers 4, 5 and 6 include photolithography and micell electrolysis.

The organic EL element arranged on the functional laminate film 20 is a conventional structure made of conventional materials. The organic EL element is constructed using conventional manufacturing methods. The organic EL element emits light over a broad range of wavelengths that includes the preferred range of from ultraviolet to bluish green.

An explanation of the present invention follows, illustrated with preferred embodiments and comparative examples.

First Embodiment (E1)

The following steps are used to fabricate a polychromatic organic EL device as shown in FIG. 3.

Formation of a Color Conversion Filter

A layer of blue color filter material (Color Mosaic CB-7001 supplied from FUJIFILM OLIN CO., LTD.) is first spin-coated onto a fusion-glass substrate 7 (143 mm×112 mm×1.1 mm). The resulting blue material layer is patterned photolithographically to achieve a line pattern of blue fluorescent layers 6. Each line pattern is 2 mm in length and 1 $\mu$m in thickness, spaced apart by 5.5 mm. Layers of a mixture of Coumarin 6 (supplied from Aldrich Chemical Co., Inc.) and poly(vinyl chloride) are then screen printed onto the substrate 7. The screen printed layers are then baked at 150° C., resulting in a line pattern of green fluorescent layers 5. Each line pattern is 2 mm in length and 12 $\mu$m in thickness, spaced apart by 5.5 mm. Next, layers of a mixture of Rhodamine 6G (supplied from Aldrich Chemical Co., Inc.) and poly(vinyl chloride) are screen printed on the substrate 7. The screen printed layers are then baked at 150° C., resulting in a line pattern of red fluorescent layers 4. Each line pattern is 2 mm in length and 30 $\mu$m in thickness, spaced apart by 5.5 mm.

Formation of a Functional Laminate Film

A hard coat layer 3 is formed by vacuum deposition of a silicon compound on a surface of a base film 1 (High Barrier Film: MOS-TH, 12 $\mu$m thick, supplied from Tokyo Oike Industry, Co., Ltd.). A coupling layer 2 is then formed on another surface of the base film 1. The coupling layer 2 is formed by roll-coating a urethane resin (S720-Q supplied from Hodogaya Chemical Co., Ltd.) with the aid of an isocyanate crosslinking agent (A100 supplied from Nippon Polyurethane Industry Co., Ltd.).

Protection of the Color Conversion Filter

The functional laminate film 20 formed as described above is roll-coated onto the color conversion filter 22 and baked at 70° C. for 2 hours to harden the coupling layer 2.

Formation of an Organic EL Element

An organic EL film is formed in a hexa-layer structure on the color conversion filter 22. The organic EL film includes anodes 8, a hole injection layer 9, a hole transport layer 10, a light-emitting layer 11, an electron injection layer 12 and cathodes 13, as shown in FIG. 3.

An Indium Tin Oxide (ITO) layer for forming transparent electrodes is first sputtered onto the entire upper surface of the hard coat layer 3. The ITO layer is then coated with a photoresistive agent (OFPR-800 supplied from Tokyo Ohka Kogyo Co., Ltd.). Conventional photolithographic processing and etching of the layers produces the anodes 8 in a stripe pattern.. Each stripe is 2 mm in length and 100 nm in thickness, spaced apart by 0.5 mm.

Figure 7:
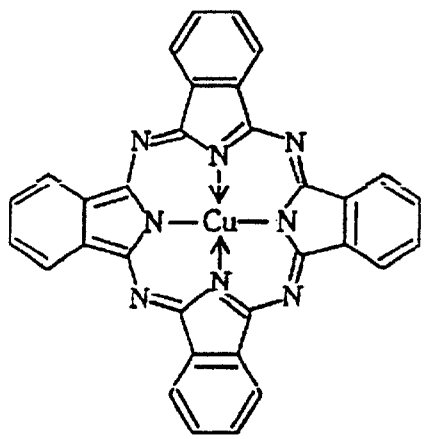
FIG. 7 describes the structural formula of copper phthalocyanine (CuPc).

The laminate so prepared is then loaded into a resistance heating type vacuum deposition chamber. While the laminate is in the chamber, the hole injection layer 9, the hole transport layer 10, the light-emitting layer 11 and the electron injection layer 12 are formed one by one without breaking the vacuum of the chamber. The pressure inside the chamber is reduced to $1 \times 10^{-4}$ Pascal during the formation of the above layers. The hole injection layer 9 is formed first, by depositing copper phthalocyanine (CuPc) on the anodes 8 and the hard coat layer 3. FIG. 7 describes the structural formula of copper phthalocyanine (CuPc). The resulting hole injection layer 9 is 100 nm in thickness.

Figure 8:
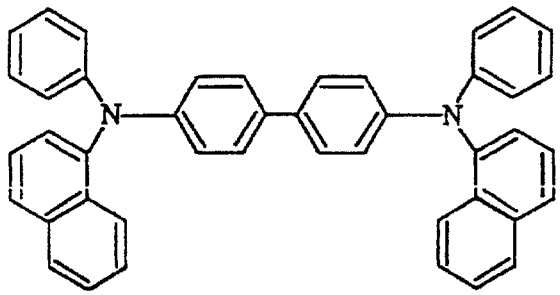
FIG. 8 describes the structural formula of 4,4'-bis['(1-naphthyl)-N-phenylamino]biphenyl (α-NPD).

The hole transport layer 10 is formed next, by depositing 4,4'-bis['(1-naphthyl)-N-phenylamino]biphenyl ($\alpha$-NPD) onto the hole injection layer 9. FIG. 8 describes the structural formula of 4,4'-bis['(1-naphthyl)-N-phenylamino] biphenyl ($\alpha$-NPD). The resulting hole transport layer 10 is 20 nm in thickness.

Figure 9:
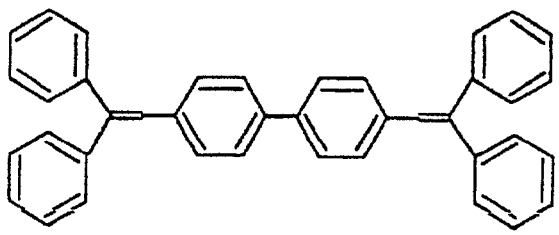
FIG. 9 describes the structural formula of 4,4'-bis(2,2-diphenylvinyl)biphenyl (DPVBi).

The light-emitting layer 11 is then formed by depositing 4,4'-bis(2,2-diphenylvinyl)biphenyl (DPVBi) onto the hole transport layer 10. FIG. 9 describes the structural formula of 4,4'-bis(2,2-diphenylvinyl)biphenyl (DPVBi). The resulting light-emitting layer 11 is 30 nm in thickness.

Figure 10:
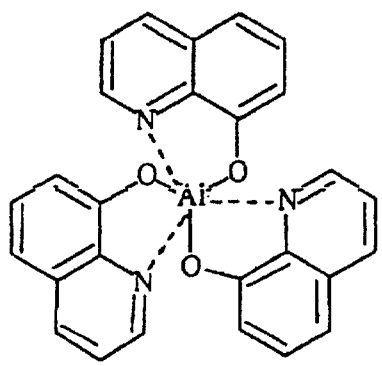
FIG. 10 describes the structural formula of aluminum chelate (Alq).

The electron injection layer 12 is formed next by depositing aluminum chelate (Alq) onto the light-emitting layer 11. FIG. 10 describes the structural formula of aluminum chelate (Alq). The resulting electron injection layer 12 is 20 nm in thickness.

The laminate so obtained is then removed from the vacuum chamber. A mask used to form a stripe pattern of cathodes 13 is then attached to the electron injection layer 12. The mask is oriented so that the cathode stripes are perpendicular to the anode stripes obtained in the ITO layer. Each of the stripes of cathode 13 is 2 mm in length and spaced apart 0.5 mm. The laminate and the attached mask are again loaded into the vacuum chamber. The cathodes 13 are then formed, consisting of Mg and Ag (10:1 in weight ratio). The resulting cathodes 13 are 200 nm in thickness.

Second Embodiment (E2)

The functional laminate film 20 according to the second embodiment is fabricated in a manner similar to the functional laminate film 20 of the above first embodiment. However, in the second embodiment, the coupling layer 2 is composed of an epoxy acrylate resin doped with a visible-light curing agent (IRGACURE-1850 supplied by Ciba Geigy AG.) measuring 1% by weight. The functional laminate film 20 is bonded onto the fluorescent layers of the color conversion filter 22. The coupling layer is then cured with light from a high-pressure mercury lamp providing 3000 mJ of irradiating energy. The light from the lamp is modified by a polycarbonate filter which passes wavelengths of 400 nm or greater. Finally, an organic EL element is formed on the upper surface of the functional laminate film 20 in the same manner as in the above first embodiment.

Comparative Example 1 (C1)

Comparative example 1 includes a protection layer that is formed on the surface of the color conversion filter 22, which includes fluorescent layers. The protection layer is formed by coating a photo-curing adhesive of a methacrylate oligomer (3112 supplied from Three Bond Co., Ltd.) over the color conversion filter 22. The adhesive is then exposed to 3000 mJ of light energy with a wavelength of 365 nm. The cured adhesive is then baked at 80° C.

An organic EL element is then formed on the upper surface of the protection layer in the same manner as in the above first embodiment.

Comparative Example 2 (C2)

A functional laminate film 20 according to comparative example 2 is formed in a manner similar to that of the above first embodiment. However, the base film 1 is a PET film that is 12 $\mu$m thick and devoid of any silicon compound. The functional laminate film 20 is bonded onto the color conversion filter 22 in the same manner as in the above first embodiment.

An organic EL element is then formed on the upper surface of the functional laminate film 20 in the same manner as in the above first embodiment.

Evaluation

Table 1 lists the evaluation results of the foregoing four devices. First and second embodiments and comparative examples 1 and 2 are designated as E1, E2, C1 and C2 respectively. In table 1 and hereafter, the functional laminate film 20 according to E1, E2 and C2, and the protection layer according to C1, are referred to collectively as the "intermediate films".

TABLE 1

| | Thickness of the intermediate films ($\mu$m) | Flatness ($\mu$m) | Angles of visibility | Life of the devices (hr.) | Influences to the fluroescent materials |
|---|---|---|---|---|---|
| E1 | 20 | <±1 | >±60° | >10000 | None |
| E2 | 20 | <±1 | >±60° | >10000 | None |
| C1 | 50 | >±5 | <±30° | <100 | Caused |
| C2 | 20 | <±1 | >±60° | <100 | None |

Evaluation 1: Thickness of the Intermediate Films

The thickness of the functional laminate film 20 is defined as the height "a" from the upper surface of the transparent substrate 7 to the upper surface of the hard coat layer 3 as described in FIG. 2. Evaluations conducted with operational tests show that protection is provided for the fluorescent materials by the very thin (20 $\mu$m) functional laminate film 20 according to the invention.

Evaluation 2: Flatness of the Intermediate Film Surface

Surface height deviation of the intermediate film on the color conversion filter 22 is examined and evaluated using a surface roughness meter (DEKTAK II A supplied by ULVAC JAPAN Ltd.). The results show that the surface height deviation of the bonded functional laminate film 20 according to the invention is within ±1 $\mu$m. However, the surface height deviation of the protection layer formed by resin coating in comparative example 1 is greater than ±5 $\mu$m.

Evaluation 3: Angle of Visibility

The angle of visibility is defined as the angle range measured from a perpendicular of the viewing surface to the point where light leakage to the adjacent fluorescent layers occurs. This observation is made when the organic EL element emits monochromatic light. Within this angle range there is no observed light leakage to the other color layers.

The evaluated devices in which the functional laminate film 20 is thin, i.e., 20 $\mu$m, display angles of visibility that are more than 60°. This angle range presents no practical barrier for operation of the devices and meets desired design goals. However, the angle of visibility for the comparative example 1, whose protection layer is thick, i.e., 50 $\mu$m, is less than 30°.

Evaluation 4: Life of the Devices

Figure 4:
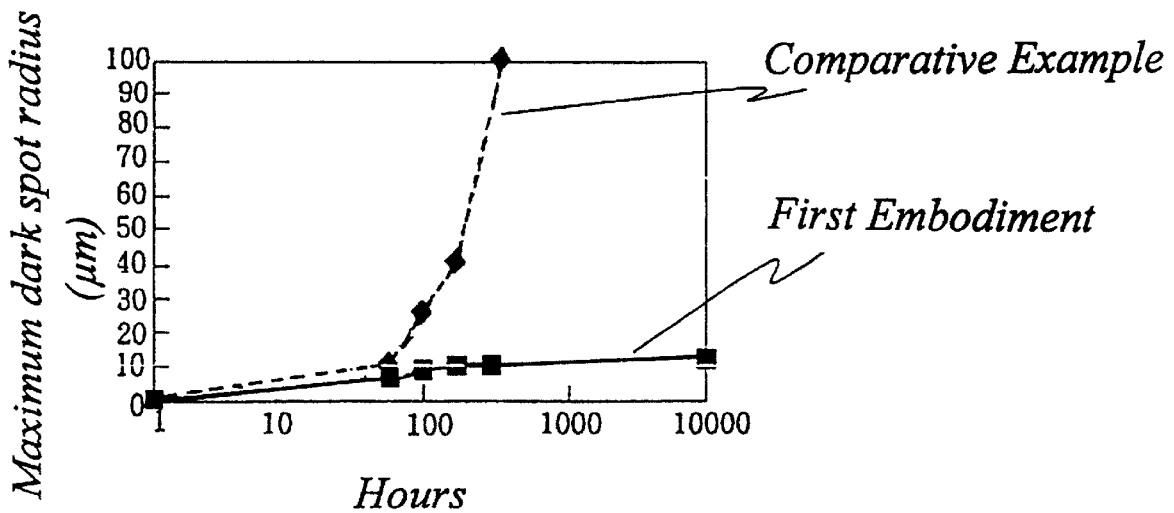
FIG. 4 is a pair of curves plotted against time showing the maximum dark spot sizes in devices according to an embodiment and a comparative example.
Figure 5:
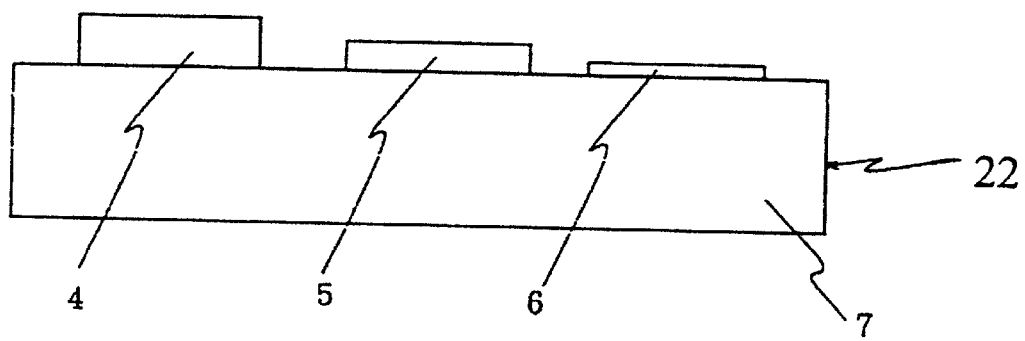
FIG. 5 is a cross section of a prior art color conversion filter.
Figure 6:
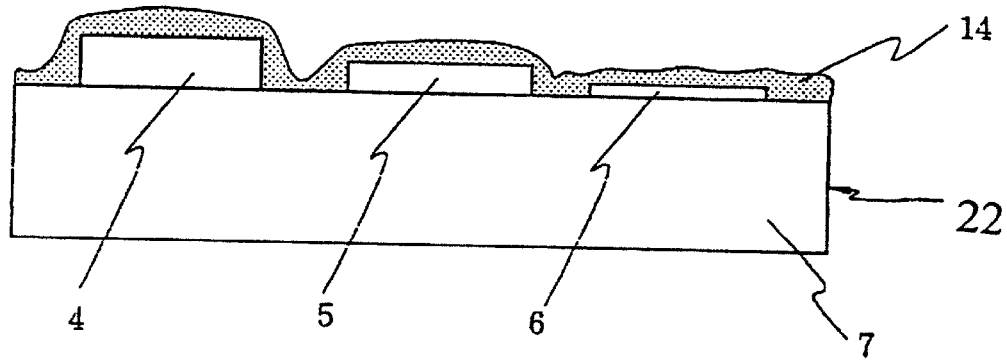
FIG. 6 is a cross section of the prior art color conversion filter of FIG. 5, covered by an inorganic oxide layer.

FIG. 4 shows a pair of curves plotted against time which chart the maximum dark spot sizes in the devices. The two curves correspond to results obtained with the first embodiment and comparative example 2. The devices are placed in a nitrogen gas stream and growth of dark spots in the respective light-emitting portions is observed using an optical microscope. Heat generated by driving the device causes the release of moisture and/or monomers from the fluorescent materials or the coupling layer. These released materials act on the sensitive materials of the organic EL element, causing them to deteriorate. Continued exposure of the materials in the EL element to these deterioration agents causes dark spots to form and grow. Observations confirm, however, that the hard coat layer 3 acts as a gas barrier and blocks the chemical species which deteriorate the organic EL element. The hard coat layer 3 according to the invention effectively prevents the formation of dark spots and constrains the growth thereof, thus extending the useful life of the devices.

Evaluation 5: Influences to the Fluorescent Materials

The above four devices are placed in a nitrogen gas stream caused to emit monochromatic light. The devices are then examined for CIE (Commission Internationale de l'Eclairage) color coordinate changes. Observations confirm that the fluorescent materials protected by the functional laminate film 20 exhibit stable performance. Stable performance is maintained after the completion of the organic EL device on the functional laminate film 20 according to the invention.

The above explanation highlights the advantages of a polychromatic display device constructed according to the present invention. The device so constructed exhibits a wide angle of visibility and is capable of light-emissions over an extended period of time. Furthermore, the manufacture of such a polychromatic display device is much less complicated than conventional devices, accompanied by greatly reduced costs.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of manufacturing a polychromatic organic electroluminescent device comprising:

depositing a plurality of spaced apart fluorescent layers on a transparent substrate to form a color conversion filter;

forming a functional laminate by depositing a transparent hard coat layer on one surface of a transparent base film and deposition a coupling layer on another surface of said transparent base film;

depositing a coupling layer on another surface of said transparent base film to form a functional laminate film;

bonding said functional laminate film onto said color conversion filter with said coupling film facing said color conversion filter; and forming an organic electroluminescent element on a surface of said transparent hard coat layer.

* * * * *

UNITED STATES PATENT AND TRADEMARK OFFICE
CERTIFICATE OF CORRECTION

PATENT NO.   : 6,309,486 B1
DATED        : October 30, 2001
INVENTOR(S)  : Koji Kawaguchi and Toshiyuki Kanno It is certified that error appears in the above-identified patent and that said Letters Patent is hereby corrected as shown below:

Column 12,
Line 3, replace "deposition" with -- depositing --.
Lines 5 to 6, delete "depositing a coupling layer on another surface of said transparent base film to form a functional laminate film;".

Signed and Sealed this

Twenty-third Day of April, 2002

Attest:

Attesting Officer

JAMES E. ROGAN
Director of the United States Patent and Trademark Office